(12) United States Patent
Chang

(10) Patent No.: US 11,384,239 B2
(45) Date of Patent: Jul. 12, 2022

(54) RESIN COMPOSITION AND ARTICLE MADE THEREFROM

(71) Applicant: ELITE MATERIAL CO., LTD., Taoyuan (TW)

(72) Inventor: Shu-Hao Chang, Taoyuan (TW)

(73) Assignee: ELITE MATERIAL CO., LTD., Taoyuan (TW)

( * ) Notice: Subject to any disclaimer, the term of this patent is extended or adjusted under 35 U.S.C. 154(b) by 325 days.

(21) Appl. No.: 16/861,249

(22) Filed: Apr. 29, 2020

(65) Prior Publication Data

US 2021/0269637 A1    Sep. 2, 2021

(30) Foreign Application Priority Data

Feb. 27, 2020   (TW) ................................. 109106434

(51) Int. Cl.
| | | |
|---|---|---|
| *C08L 71/12* | (2006.01) | |
| *C08K 3/36* | (2006.01) | |
| *C08K 3/38* | (2006.01) | |
| *C08L 71/00* | (2006.01) | |
| *C08J 5/24* | (2006.01) | |
| *H05K 1/03* | (2006.01) | |
| *B32B 27/28* | (2006.01) | |

(52) U.S. Cl.
CPC ............ *C08L 71/00* (2013.01); *B32B 27/285* (2013.01); *C08J 5/24* (2013.01); *C08J 5/244* (2021.05); *C08L 71/12* (2013.01); *C08L 71/126* (2013.01); *H05K 1/0373* (2013.01); *C08J 2371/12* (2013.01); *C08J 2471/12* (2013.01); *C08K 2003/385* (2013.01); *C08L 2205/025* (2013.01); *C08L 2205/03* (2013.01); *C08L 2205/20* (2013.01)

(58) Field of Classification Search
None
See application file for complete search history.

(56) References Cited

U.S. PATENT DOCUMENTS

| | | | |
|---|---|---|---|
| 2019/0194383 A1* | 6/2019 | Cheng | ................ C08K 5/34924 |
| 2020/0247947 A1* | 8/2020 | Chen | ..................... C08L 53/025 |
| 2021/0238381 A1* | 8/2021 | Nakazu | .................. H01L 23/14 |

* cited by examiner

*Primary Examiner* — David J Buttner

(57) ABSTRACT

The present disclosure provides a resin composition which comprises: 90 parts by weight of vinyl-containing polyphenylene oxide resin; 35 to 70 parts by weight of chemically synthetic silica; and 10 to 30 parts by weight of spherical inorganic fillers, wherein the spherical inorganic fillers include spherical boron nitride, spherical hollow boron silicate or a combination thereof. The present disclosure also provides an article made from the resin composition, wherein the article includes a prepreg, a resin film, a laminate or a printed circuit board. The resin composition of the invention can make the article made therefrom achieve better peeling strength, dielectric constant, dissipation factor, no weave exposure produced and no stripes of branch-like pattern produced at the laminate edge.

11 Claims, 2 Drawing Sheets

RESIN COMPOSITION AND ARTICLE MADE THEREFROM

CROSS-REFERENCE TO RELATED APPLICATION

This non-provisional application claims priority under 35 U.S.C. § 119(a) on Patent Application No(s). 109106434 filed in Taiwan, R.O.C. on Feb. 27, 2020, the entire contents of which are hereby incorporated by reference.

BACKGROUND OF THE INVENTION

1. Field of the Invention

The present disclosure relates to a resin composition, and in particular to a resin composition comprising vinyl-containing polyphenylene oxide resin. The invention also relates to an article made from the resin composition.

2. Description of the Related Art

With the rapid advancement of electronic technology, information processing in mobile communication, servers, cloud storage and other electronic products has been incessantly directed toward high frequency signal transmission and high speed digitalization, and low dielectric resin material has become the mainstream for the development of laminates for high speed data transmission in order to satisfy the demands of high speed information transmission. The requirements for the products of resin materials such as copper clad laminates are mainly reflected in the material with all these properties of a low dissipation factor (Df), high peeling strength and better laminate appearance, and the like. Therefore, there is a need for developing materials suitable for a printed circuit board (PCB) with overall excellent properties.

In view of the shortcomings of the above-mentioned prior art, the inventor felt that it was not perfect, and exhausted his mind to research carefully into a way for overcoming the problems, and then developed a resin composition and an article made from the resin composition based on his years of experience in the art.

BRIEF SUMMARY OF THE INVENTION

A main objective of the present disclosure is to provide a resin composition, comprising: 90 parts by weight of vinyl-containing polyphenylene oxide resin; 35 to 70 parts by weight of chemically synthetic silica; and 10 to 30 parts by weight of spherical inorganic fillers, wherein the spherical inorganic fillers may comprise spherical boron nitride, spherical hollow boron silicate or a combination thereof.

In an embodiment, the vinyl-containing polyphenylene oxide resin comprises vinylbenzyl polyphenylene oxide resin, methacrylate polyphenylene oxide resin, allyl polyphenylene oxide resin, vinylbenzyl-modified bisphenol A polyphenylene oxide, vinyl chain-extended polyphenylene oxide or a combination thereof.

In an embodiment, the chemically synthetic silica comprises silica synthesized by chemical method, having a median particle diameter (D50) of 0.01 to 9 micrometer.

In an embodiment, the chemically synthetic silica is selected from silica synthesized by chemical method, made by microemulsion.

In an embodiment, the spherical boron nitride comprises spherical boron nitride with an aspect ratio of 1.0 to 2.0.

In an embodiment, the spherical boron nitride comprises spherical boron nitride agglomerates formed by agglomerating the common boron nitride, for example, spherical boron nitride agglomerates formed by agglomerating hexagonal boron nitride sheets.

In an embodiment, the spherical hollow boron silicate comprises spherical hollow boron silicate with a density of 0.12 to 0.6 g/cm$^3$.

In addition to the aforesaid components, the resin composition of the present disclosure may optionally further comprise maleimide resin, small molecular vinyl compound (i.e., small molecular weight vinyl compound), acrylate, polyolefin, epoxy resin, cyanate ester resin, phenolic resin, benzoxazine resin, styrene maleic anhydride, polyester resin, amine curing agent, polyamide resin, polyimide resin or a combination thereof.

In addition to the aforesaid components, the resin composition of the invention may optionally further comprise flame retardant, inorganic fillers other than the aforesaid spherical boron nitride and spherical hollow boron silicate, curing accelerator, solvent, silane coupling agent, coloring agent, toughening agent or a combination thereof.

Another main objective of the present disclosure is to provide an article made from the resin composition, wherein the article comprises a prepreg, a resin film, a laminate or a printed circuit board.

In an embodiment, the article has one, more or all of the following properties:

a peel strength as measured by reference to the method of IPC-TM-650 2.4.8 is greater than or equal to 3.00 lb/in;

a dissipation factor at a frequency of 10 GHz as measured by reference to the method of JIS C2565 is less than or equal to 0.0030;

a dielectric constant at a frequency of 10 GHz as measured by reference to the method of JIS C2565 is less than or equal to 3.40;

a surface of laminate appearance is flat and smooth without weave exposure;

no branch-like pattern is produced at a laminate edge after lamination.

As described above, the main objective of the present disclosure is to provide a resin composition, comprising: 90 parts by weight of vinyl-containing polyphenylene oxide resin; 35 to 70 parts by weight of chemically synthetic silica; and 10 to 30 parts by weight of spherical inorganic fillers, wherein the spherical inorganic fillers may comprise spherical boron nitride, spherical hollow boron silicate or a combination thereof.

In an embodiment, the vinyl-containing polyphenylene oxide resin may comprise a polyphenylene oxide resin with vinyl groups at the terminal.

For example, the vinyl-containing polyphenylene oxide resin may comprise a structure as shown by formula (A):

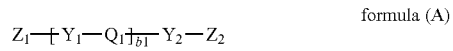

formula (A)

wherein b1 is natural number of 0 to 10;

Q1 includes any one of structures as shown by formula (A-1) to formula (A-3):

formula (A-1)

-continued

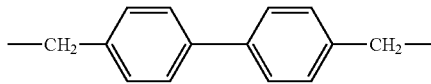

formula (A-2)

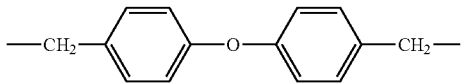

formula (A-3)

Y1 and Y2 individually include a structure as shown by formula (A-4):

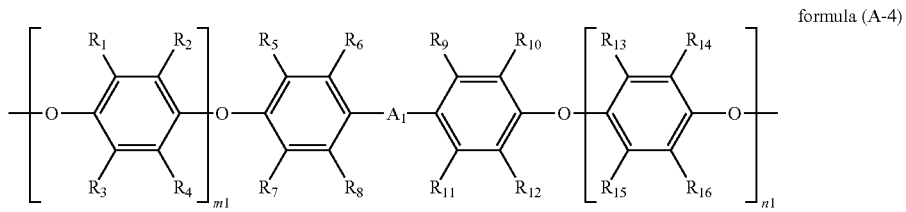

formula (A-4)

In formula (A-4), m1 and n1 are individually an integer of 1 to 30 (e.g., 1, 5, 10, 15, 20, 25 or 30); $R_1$ to $R_{16}$ individually include H, —$CH_3$ or halogen atom (e.g., chlorine, bromine or iodine); A1 is selected from covalent bond, —$CH_2$—, —$CH(CH_3)$—, —$C(CH_3)_2$—, —O—, —S—, —$SO_2$— or carbonyl group;

Z1 and Z2 individually include structures as shown by formula (A-5) to formula (A-7):

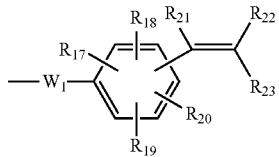

formula (A-5)

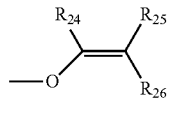

formula (A-6)

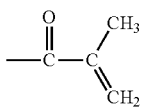

formula (A-7)

wherein $R_{17}$ to $R_{26}$ are individually selected from H, —$CH_3$ or halogen atom, and $W_1$ and Q are individually C1-C3 bivalent aliphatic group (e.g. methylene, ethylene or propylene).

The specific examples of the vinyl-containing polyphenylene oxide resin comprise, but are not limited to vinylbenzyl polyphenylene oxide resin (e.g., OPE-2st 1200 or OPE-2st 2200, available from Mitsubishi Gas Chemical Co., Inc.), methacrylate polyphenylene oxide resin (e.g., SA-9000, available from SABIC), allyl polyphenylene oxide resin, vinylbenzyl-modified bisphenol A polyphenylene oxide, vinyl chain-extended polyphenylene oxide or a combination thereof, and not limited thereto. For example, the aforesaid vinyl chain-extended polyphenylene oxide may include various polyphenylene oxide resins disclosed in the US Patent Application Publication No. 2016/0185904 A1, all of which are incorporated herein by reference in their entirety.

Unless otherwise specified, the scope of vinyl-containing polyphenylene oxide resin in the invention also comprises modified products thereof, for example, but is not limited to products after modifying the reactive functional groups of vinyl-containing polyphenylene oxide resin, products after vinyl-containing polyphenylene oxide resin prepolymerizing with other resins, products after vinyl-containing polyphenylene oxide resin crosslinking with other resins, products after vinyl-containing polyphenylene oxide resin carrying out homopolymerization, products after vinyl-containing polyphenylene oxide resin copolymerizing with polyphenylene oxide resin having a vinyl group at another different terminal, and so on.

In an embodiment, the aforesaid chemically synthetic silica comprises silica which is synthesized by using any one chemical method, for example, including silica made from silane compound through a chemical reaction, for example silica made by sol-gel process, microemulsion, flame synthesis, co-precipitation, chemical vapor deposition or spray method. The silica of the common fusing method is a fused silica that is made by using a crushed silica crystal fusing in a furnace. Compared to the silica of the common fusing method, the silica synthesized by chemical method has differences in obtaining raw material of silica and manufacturing method, wherein the preferred chemically synthetic silica is the silica synthesized by chemical method that is made by using microemulsion. For example, the chemically synthetic silica may be the silica synthesized by chemical method that has a median particle diameter (D50) less than or equal to 10 micrometer, preferably the silica synthesized by chemical method that has a median particle diameter (D50) of 0.01 to 9 micrometer, preferably the silica synthesized by chemical method that has a median particle diameter (D50) of 0.015 to 5 micrometer, more preferably the silica synthesized by chemical method that has a median particle diameter (D50) of 0.015 to 3 micrometer. For example, the chemically synthetic silica may be the silica synthesized by chemical method that has a particle diameter (D99) less than or equal to 10 micrometer, preferably the silica synthesized by chemical method that has a particle diameter (D99) of 0.01 to 9 micrometer, preferably the silica synthesized by chemical method that has a particle diameter (D99) of 0.02 to 5 micrometer. For example, the chemically synthetic silica may be chemically synthetic silica produced by Ginet new material technology Co., Ltd.

The particle diameter is a range of particle size distribution determined by laser diffraction analysis. The median particle diameter (D50) indicates a particle diameter that corresponds to the accumulative volume distribution of inorganic fillers (for example, but not limited to chemically synthetic silica) reaching 50%, and the particle diameter (D99) indicates a particle diameter that corresponds to the accumulative volume distribution of inorganic fillers (for example, but not limited to chemically synthetic silica) reaching 99%.

For example, the silica synthesized by chemical method that is made by microemulsion is chemically synthetic silica that is formed by using cyclohexane as oil phase, using ammonium hydroxide as catalyst and controlling a suitable pH value to form a micellar structure after adding a surfactant and deionized water, and then adding an appropriate amount of silicon source to carry out reaction, the silicon source carrying out hydrolysis, nucleation and growth in the micellar environment. Compared to other types of methods, for example sol-gel process, flame synthesis, co-precipitation, chemical vapor deposition or spray method, the chemically synthetic silica made by microemulsion can achieve a preferable particle dispersion, and microemulsion can obtain a spherical chemically synthetic silica having a high uniformity of particle distribution.

For example, examples of the aforesaid silicon source comprise, but are not limited to silanol, silicate (for example, tertaethoxysilane ($Si(OC_2H_5)_4$), tertamethoxysilane, tetrapropoxysilane, etc.).

In an embodiment, the aforesaid spherical boron nitride comprises, but is not limited to a spherical boron nitride itself or a spherical boron nitride agglomerate formed by agglomerating other shapes of boron nitride, and may preferably be a spherical boron nitride agglomerate. For example, a common boron nitride belongs to a structure of hexagonal boron nitride sheets (or layers), and examples of the spherical boron nitride agglomerate include, but are not limited to a spherical boron nitride agglomerate that is formed by using the common hexagonal boron nitride sheets as raw material, and using such as organometallic compounds, inorganometallic compounds or nano ceramic materials as adhesive, followed by spray drying and sintering. For example, the so-called spherical shape indicates that an aspect ratio (it is also called a ratio of long diameter and short diameter) of powder diameter is preferably 1.0 and above; and 2.0 and below, more preferably 1.0 and above; and 1.5 and below, and the aspect ratio is a result obtained by arbitrarily selecting over 200 spherical boron nitride particles to calculate an average aspect ratio through an image taken by scanning electron microscope (SEM). For example, the spherical boron nitride may be a spherical boron nitride with an average diameter less than or equal to 100 micrometer, preferably a spherical boron nitride with an average diameter of 10 to 90 micrometer, preferably a spherical boron nitride with an average diameter of 20 to 80 micrometer. For example, the spherical boron nitride may be spherical boron nitride products such as PTX25 or PTX60 available from MOMENTIVE.

In an embodiment, the aforesaid spherical hollow boron silicate comprises, but is not limited to a spherical hollow boron silicate (it is also called hollow glass spherule) made by a known method, for example: adding a flammable liquid into a mixture containing a component which is suitable to prepare glass and foaming agent, then all compositions undergoing a wet grinding operation to obtain a dispersion with particles having average diameter of 3 micrometer, followed by atomizing the slurry through a two-fluid nozzle at the pressure of 0.2 and 2 trillion Pa to form droplets, heating the droplets to result in the formation of spherical hollow boron silicate. For example, the spherical hollow boron silicate preferably has a density of 0.1 to 1 $g/cm^3$, more preferably has a density of 0.12 to 0.8 $g/cm^3$, more preferably has a density of 0.12 to 0.6 $g/cm^3$. For example, the spherical hollow boron silicate may be a spherical hollow boron silicate with an average diameter less than or equal to 100 micrometer, preferably a spherical hollow boron silicate with an average diameter of 10 to 90 micrometer, preferably a spherical hollow boron silicate with an average diameter of 15 to 70 micrometer. For example, the spherical hollow boron silicate may be spherical hollow boron silicate products such as iM16K, S32, S38HS, K37 or XLD37 available from 3M.

In an embodiment, the resin composition of the invention may optionally further add a crosslinking agent, wherein the crosslinking agent comprises maleimide resin, small molecular vinyl compound, acrylate, polyolefin, epoxy resin, cyanate ester resin, phenolic resin, benzoxazine resin, styrene maleic anhydride, polyester resin, amine curing agent, polyamide resin, polyimide resin or a combination thereof.

In an embodiment, 5 to 150 parts by weight of the crosslinking agent may be further added to the resin composition, 5 to 90 parts by weight of the crosslinking agent may be preferably further added to the resin composition, 8 to 50 parts by weight of the crosslinking agent may be more preferably further added to the resin composition.

For example, the aforesaid maleimide resin refers to a compound or mixture containing at least one maleimide group in the molecule. Unless otherwise specified, the maleimide resin used in the present disclosure may include any one or more maleimide resins useful for preparing a prepreg, a resin film, a laminate or a printed circuit board. The specific examples include, but are not limited to 4,4'-diphenylmethane oligomer of phenylmethane maleimide (or referred to as polyphenylmethane maleimide), bismaleimide toluene, diethyl bismaleimide toluene, m-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, 1,6-bismaleimide-(2,2,4-trimethyl)hexane, 2,3-xylylmaleimide, 2,6-xylenemaleimide, N-phenylmaleimide, maleimide resin containing aliphatic long chain structure or a combination thereof. Preferably, the maleimide resin is maleimide resin containing aliphatic long chain structure. In addition, unless otherwise specified, the maleimide resin of the invention also comprises a prepolymer of the aforesaid compound, for example, may be a prepolymer of diallyl compound and maleimide compound, a prepolymer of diamine and maleimide compound, a prepolymer of multi-functional amine and maleimide compound or a prepolymer of acid phenol compound and maleimide compound, and not limited thereto.

For example, the maleimide resin may be maleimide resin products such as BMI-1000, BMI-1000H, BMI-1100, BMI-1100H, BMI-2000, BMI-2300, BMI-3000, BMI-3000H, BMI-4000, BMI-4000H, BMI-5000, BMI-5100, BMI-7000 and BMI-7000H available from Daiwa Kasei Co., Ltd., or maleimide resin products such as BMI-70, BMI-80 available from K.I chemical company, or maleimide resin products such as Compimide MDAB, Compimide TDAB, Compimide DE-TDAB available from Evonik chemical company.

For example, the aforesaid maleimide resin containing aliphatic long chain structure may be maleimide resin products such as BA, 689, BMI-1400, BMI-1500, BMI-1700, BMI-2500, BMI-3000, BMI-3000J, BMI3000G, BMI-3000GE, BMI-5000 and BMI-6000 available from Designer Molecules Inc.

In a preferred embodiment, relative to 90 parts by weight of the vinyl-containing polyphenylene oxide resin, in the present disclosure, the resin composition comprises 2 to 80 parts by weight of the maleimide resin, 5 to 50 parts by weight of the maleimide resin, or 5 to 45 parts by weight of the maleimide resin.

For example, the small molecular vinyl compound refers to a vinyl compound with a molecular weight less than or equal to 1000, preferably a molecular weight between 100 and 900, more preferably a molecular weight between 100 and 800. In the present disclosure, the small molecular vinyl compound may be, but is not limited to any one or a combination of bis(vinylbenzyl) ether (BVBE), bis(vinylphenyl) ethane (BVPE), triallyl isocyanurate (TAIC), triallyl cyanurate (TAC), 1,2,4-trivinyl cyclohexane (TVCH).

In a preferred embodiment, relative to 90 parts by weight of the vinyl-containing polyphenylene oxide resin, in the present disclosure, the resin composition comprises 3 to 50 parts by weight of the small molecular vinyl compound, 5 to 40 parts by weight of the small molecular vinyl compound, or 5 to 35 parts by weight of the small molecular vinyl compound.

For example, the aforesaid acrylate comprises, but is not limited to tricyclodecane dimethacrylate, trimethacrylate, 1,1'-[(octahydro-4,7-methano-1H-indene-5,6-diyl)bis(methylene)]ester (e.g., SR833S, available from Sartomer) or a combination thereof.

In a preferred embodiment, relative to 90 parts by weight of the vinyl-containing polyphenylene oxide resin, in the present disclosure, the resin composition comprises 3 to 50 parts by weight of the acrylate, 5 to 40 parts by weight of the acrylate, or 5 to 35 parts by weight of the acrylate.

In an embodiment, examples of the aforesaid polyolefin include, but is not limited to styrene-butadiene-divinylbenzene terpolymer, styrene-butadiene-maleic anhydride terpolymer, vinyl-polybutadiene-urethane oligomer, styrene-butadiene copolymer, hydrogenated styrene-butadiene copolymer, styrene-isoprene copolymer, hydrogenated styrene-isoprene copolymer, hydrogenated styrene-butadiene-divinylbenzene terpolymer, styrene-ethylene-butene-styrene terpolymer, polybutadiene (i.e., butadiene homopolymer), maleic anhydride-butadiene copolymer, methylstyrene copolymer, hydroxyl-terminated hydrogenated polybutadiene, vinyl-modified hydroxyl-terminated hydrogenated polybutadiene (no longer having hydroxyl) or a combination thereof. Preferably, the polyolefin is styrene-butadiene copolymer, hydrogenated styrene-butadiene copolymer, vinyl-modified hydroxyl-terminated hydrogenated polybutadiene, styrene-ethylene-butene-styrene terpolymer, polybutadiene, maleic anhydride-butadiene copolymer.

In a preferred embodiment, relative to 90 parts by weight of the vinyl-containing polyphenylene oxide resin, in the present disclosure, the resin composition comprises 5 to 150 parts by weight of the polyolefin, 5 to 80 parts by weight of the polyolefin, 5 to 50 parts by weight of the polyolefin, 5 to 35 parts by weight of the polyolefin, or 8 to 15 parts by weight of the polyolefin.

For example, the aforesaid epoxy resin may be various types of epoxy resins known in the field, including but not limited to, for example bisphenol A epoxy resin, bisphenol F epoxy resin, bisphenol S epoxy resin, bisphenol AD epoxy resin, novolac epoxy resin, trifunctional epoxy resin, tetrafunctional epoxy resin, multifunctional novolac epoxy resin, dicyclopentadiene (DCPD) epoxy resin, phosphorous-containing epoxy resin, p-xylene epoxy resin, naphthalene epoxy resin (e.g. naphthol epoxy resin), benzofuran epoxy resin, isocyanate-modified epoxy resin, wherein the novolac epoxy resin may be phenol novolac epoxy resin, bisphenol A novolac epoxy resin, bisphenol F novolac epoxy resin, biphenyl novolac epoxy resin, phenol benzaldehyde epoxy resin, phenol aralkyl novolac epoxy resin or o-cresol novolac epoxy resin, wherein the phosphorus-containing epoxy resin may be DOPO (9,10-dihydro-9-oxa-10-phosphaphenanthrene-10-oxide) epoxy resin, DOPO-HQ epoxy resin or a combination thereof. The DOPO epoxy resin may be selected from one or more than one of DOPO-containing phenolic novolac epoxy resin, DOPO-containing cresol novolac epoxy resin and DOPO-containing bisphenol-A novolac epoxy resin; the DOPO-HQ epoxy resin may be selected from one or more than one of DOPO-HQ-containing phenolic novolac epoxy resin, DOPO-HQ-containing cresol novolac epoxy resin and DOPO-HQ-containing bisphenol-A novolac epoxy resin.

For example, the aforesaid cyanate ester resin may be any one or more cyanate ester useful for preparing a prepreg, a resin film, a laminate or a printed circuit board, for example having any compound with an Ar—O—C≡N structure, wherein Ar represents a substituted or unsubstituted aromatic group. The specific examples of the cyanate ester resin include, but are not limited to novolac cyanate ester resin, bisphenol A cyanate ester resin, bisphenol F cyanate ester resin, dicyclopentadiene-containing cyanate ester resin, naphthalene-containing cyanate ester resin, phenolphthalein cyanate ester resin, adamantane cyanate ester resin, fluorene cyanate ester resin or a combination thereof. The novolac cyanate ester resin may be phenol novolac cyanate ester resin, bisphenol A novolac cyanate ester resin, bisphenol F novolac cyanate ester resin or a combination thereof. For example, the cyanate ester resin may be available under the tradename Primaset PT-15, PT-30S, PT-60S, BA-200, BA-230S, BA-3000S, BTP-2500, BTP-6020S, DT-4000, DT-7000, ULL950S, HTL-3000, CE-320, LVT-50, LeCy, and so on sold by Lonza.

For example, the aforesaid phenolic resin may comprise, but is not limited to mono-functional, bifunctional or multifunctional phenolic resin, comprising phenolic resin of a resin composition that is conventionally useful for making prepregs, such as phenoxy resin, novolac resin.

For example, the benzoxazine resin includes, but is not limited to, bisphenol A benzoxazine resin, bisphenol F benzoxazine resin, phenolphthalein benzoxazine resin, dicyclopentadiene benzoxazine resin, phosphorus-containing benzoxazine resin, oxydianiline benzoxazine resin, or unsaturated bond containing benzoxazine resin, such as but not limited to the tradename LZ-8270, LZ-8280, LZ-8290 or LZ-8298 available from Huntsman, or the tradename HFB-2006M available from Showa High Polymer, or the tradename KZH-5031 available from Kolon Industries, Korea.

For example, in the aforesaid styrene maleic anhydride, the ratio of styrene (S) and maleic anhydride (MA) may be 1/1, 2/1, 3/1, 4/1, 6/1, 8/1 or 12/1, for example styrene maleic anhydride copolymers such as SMA-1000, SMA-2000, SMA-3000, EF-30, EF-40, EF-60 and EF-80 available from Cray Valley, or styrene maleic anhydride copolymers such as C400, C500, C700 and C900 available from Polyscope.

For example, the aforesaid polyester resin may be prepared by esterification of dicarboxylic aromatic compounds with dihydroxyl aromatic compounds. The polyester resin may include, but is not limited to HPC-8000, HPC-8150 or HPC-8200 available from DIC Corporation.

For example, the aforesaid amine curing agent may include, but is not limited to, at least one or a combination of diamino diphenyl sulfone, diamino diphenyl methane, diamino diphenyl ether, diamino diphenyl sulfide and dicyandiamide.

For example, the aforesaid polyamide resin may be various types polyamide resins known in the field, including but not limited to various commercially available polyamide resin products.

For example, the aforesaid polyimide resin may be various types of polyimide resins known in the field, including but not limited to various commercially available polyimide resin products.

In an embodiment of the invention, the resin composition may optionally further comprise flame retardant, inorganic fillers other than the aforesaid spherical boron nitride and spherical hollow boron silicate, curing accelerator, solvent, silane coupling agent, coloring agent, toughening agent or a combination thereof.

For example, the aforesaid flame retardant may be any one or more flame retardants useful for preparing a prepreg, a resin film, a laminate or a printed circuit board; examples of flame retardant include, but are not limited to phosphorus-containing flame retardant, preferably including: ammonium polyphosphate, hydroquinone bis-(diphenyl phosphate), bisphenol A bis-(diphenylphosphate), tri(2-carboxyethyl) phosphine (TCEP), phosphoric acid tris(chloroisopropyl) ester, trimethyl phosphate (TMP), dimethyl methyl phosphonate (DMMP), resorcinol bis(dixylenyl phosphate) (RDXP, such as commercially available PX-200, PX-201, and PX-202), phosphazene (such as commercially available SPB-100, SPH-100, and SPV-100), melamine polyphosphate, DOPO and its derivatives or resins, DPPO (diphenylphosphine oxide) and its derivatives or resins, melamine cyanurate, tri-hydroxy ethyl isocyanurate and aluminium phosphinate (e.g., commercially available OP-930 and OP-935) or a combination thereof.

For example, the flame retardant may be a DPPO compound (e.g., di-DPPO compound such as commercially available PQ-60), a DOPO compound (e.g., di-DOPO compound), a DOPO resin (e.g., DOPO-HQ, DOPO-NQ, DOPO-PN and DOPO-BPN) and a DOPO-bonding epoxy resin, wherein DOPO-PN is a DOPO phenol novolac compound, and DOPO-BPN may be a bisphenol novolac compound, such as DOPO-BPAN (DOPO-bisphenol A novolac), DOPO-BPFN (DOPO-bisphenol F novolac) or DOPO-BPSN (DOPO-bisphenol S novolac).

For example, the inorganic fillers other than the aforesaid spherical boron nitride and spherical hollow boron silicate may be any one or more inorganic fillers other than the aforesaid spherical boron nitride and spherical hollow boron silicate useful for preparing a prepreg, a resin film, a laminate or a printed circuit board; the specific examples thereof include, but are not limited to non-chemically synthetic silica (fused, non-fused, porous or hollow type), aluminum oxide, aluminum hydroxide, magnesium oxide, magnesium hydroxide, calcium carbonate, aluminum nitride, non-spherical boron nitride, aluminum silicon carbide, silicon carbide, titanium dioxide, zinc oxide, zirconium oxide, mica, boehmite (A100H), calcined talc, talc, silicon nitride and calcined kaolin. Moreover, the inorganic fillers can be spherical, fibrous, plate-like, particulate, sheet-like or whisker-like and can be optionally pretreated by a silane coupling agent.

For example, the aforesaid curing accelerator (including a curing initiator) may comprise a catalyst, such as a Lewis base or a Lewis acid. The Lewis base may comprise any one or more of imidazole, boron trifluoride-amine complex, ethyltriphenyl phosphonium chloride, 2-methylimidazole (2MI), 2-phenyl-1H-imidazole (2PZ), 2-ethyl-4-methylimidazole (2E4MI), triphenylphosphine (TPP) and 4-dimethyl-aminopyridine (DMAP). The Lewis acid may comprise metal salt compounds, such as those of manganese, iron, cobalt, nickel, copper and zinc, such as metallic catalysts of zinc octanoate or cobalt octanoate. The curing accelerator also includes a curing initiator, for example a peroxide capable of producing free radicals, including but not limited to dicumyl peroxide, tert-butyl peroxybenzoate, dibenzoyl peroxide (BPO), 2,5-dimethyl-2,5-di(tert-butylperoxy)-3-hexyne (25B), bis(tert-butylperoxyisopropyl)benzene or a combination thereof.

For example, the aforesaid solvent is not particularly limited and may be any one of solvent suitable to solve the resin composition of the invention that comprises, but is not limited to, methanol, ethanol, ethylene glycol monomethyl ether, acetone, butanone (methyl ethyl ketone), methyl isobutyl ketone, cyclohexanone, toluene, xylene, methoxyethyl acetate, ethoxyethyl acetate, propoxyethyl acetate, ethyl acetate, dimethylformamide, dimethylacetamide, propylene glycol methyl ether, or a mixture thereof.

For example, the aforesaid silane coupling agent may comprise silane (such as, but is not limited to siloxane), which may be further categorized according to the functional groups into amino silane, epoxide silane, vinyl silane, acrylate silane, methacrylate silane, hydroxyl silane, isocyanate silane, methacryloxy silane and acryloxy silane.

For example, the foresaid coloring agent may comprise, but is not limited to dye or pigment.

In the invention, the purpose of adding toughening agent is to improve the toughness of the resin composition. For example, the toughening agent may comprise, but is not limited to compound of rubber resin, carboxyl-terminated butadiene acrylonitrile rubber (CTBN rubber), core-shell rubber, or a combination thereof.

The resin compositions of various embodiments may be processed into different articles, including but not limited to a prepreg, a resin film, a laminate or a printed circuit board.

For example, the resin compositions of various embodiments of the invention may be made into prepregs that have a reinforcement material and a layered structure (collectively referred to as insulation layer) formed thereon, wherein the layered structure is made by heating the resin composition at a high temperature to a semi-cured state (B-stage), and baking temperature for making the prepreg may be for example 120° C. to 160° C. The reinforcement material may be any one of fiber material, woven fabric and non-woven fabric, and the woven fabric preferably comprises fiberglass fabric. Types of fiberglass fabric are not particularly limited and may be any commercial fiberglass fabric useful for various printed circuit boards, such as E-glass fabric, D-glass fabric, S-glass fabric, T-glass fabric, L-glass fabric or Q-glass fabric, wherein the fiber may comprise yarns and rovings, in spread form or standard form. Non-woven fabric preferably comprises non-woven fabric made from liquid crystal resin, such as polyester non-woven fabric, polyurethane non-woven fabric, but not limited thereto. Woven fabric may also comprise woven fabric made from liquid crystal resin, such as polyester woven fabric, polyurethane woven fabric, but not limited thereto. The reinforcement material may increase the mechanical strength of the prepreg. In a preferred embodiment, the reinforcement material may be selectively pretreated with a silane coupling agent. The prepreg may be further heated and cured to the C-stage to form an insulation layer.

For example, the resin compositions of various embodiments of the invention may be coated on a liquid crystal resin film, polyethylene terephthalate film (PET film, a.k.a. polyester film), a polyimide film (PI film), a copper foil or a resin coated copper (RCC), followed by heating and baking to a semi-cured state (B-Stage) to obtain a resin film.

For example, the resin compositions of various embodiments of the invention may be made into a laminate such as a copper-clad laminate, which comprises two copper foils and an insulation layer disposed between the copper foils, wherein the insulation layer is made by curing the resin composition at high temperature and high pressure, a suitable curing temperature being for example between 190° C. and 220° C., preferably between 200° C. and 215° C., and a curing time being 90 to 180 minutes, preferably 110 to 150 minutes. The insulation layer may be obtained by curing the aforesaid prepreg or resin film. In a preferred embodiment, the laminate is a copper-clad laminate.

In an embodiment, the laminate may be further processed by trace formation processes to obtain a printed circuit board.

In order to further disclose the present invention for it to be carried out by a person ordinarily skilled in the art, the following several embodiments are used to further illustrate the present invention. However, it should be noted that the following embodiments merely further illustrate the invention, and they should not be considered to limit the implementing scope of the invention, and various possible modifications and alterations to the details of the specification could be achieved by any person ordinarily skilled in the art without departing from the spirit of the present invention that are embraced therein.

DETAILED DESCRIPTION OF THE INVENTION

Figure 1:
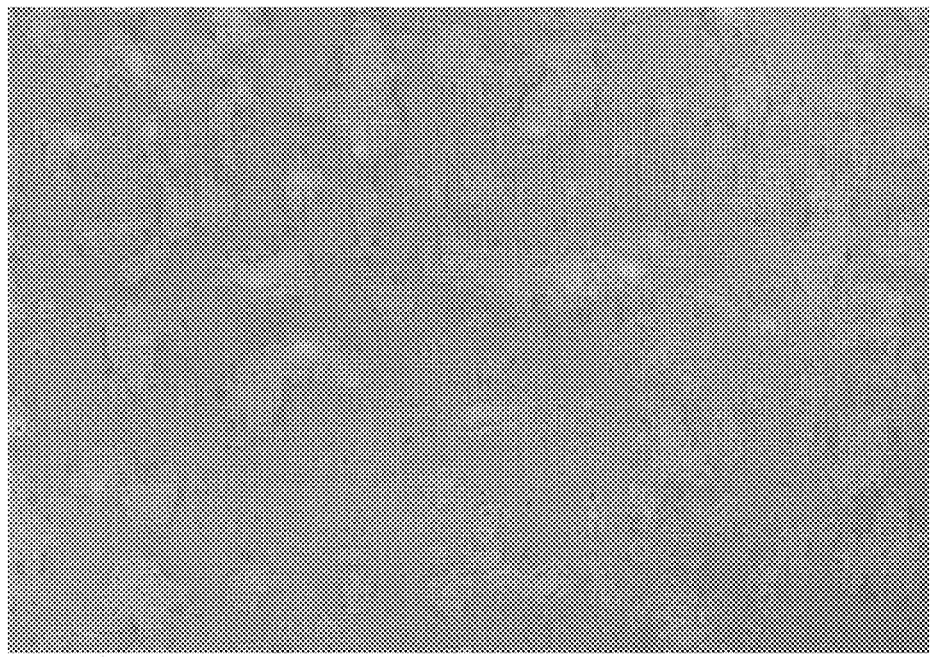
FIG. 1 is a schematic view of a copper-free laminate having weave exposure.

To facilitate understanding of the object, characteristics and effects of this present disclosure, the following embodiments for the detailed description of the present disclosure are provided.

Raw Materials

SA-9000: methacrylate polyphenylene oxide resin, available from SABIC.

OPE-2st: OPE-2st 2200, vinylbenzyl polyphenylene oxide resin, available from Mitsubishi Gas corporation.

Ricon 257: styrene-butadiene-divinyl benzene terpolymer, available from Cray Valley.

PQ-60: p-xylylene-bis-diphenylphosphine oxide, available from Chin Yee Chemical Industries Co., Ltd.

Chemically synthetic spherical silica A: having a median particle diameter about 1.5±0.5 micrometer, made by microemulsion, chemically synthetic spherical silica with a surface treating by silane coupling agents, available from Ginet new material technology Co., Ltd.

Chemically synthetic spherical silica B: having a median particle diameter about 1.5±0.5 micrometer, chemically synthetic spherical silica made by microemulsion, available from Ginet new material technology Co., Ltd.

PTX60: spherical boron nitride agglomerate with an aspect ratio of 1.0 to 1.5, available from MOMENTIVE company.

iM16K: spherical hollow boron silicate with a density of about 0.46 g/cm$^3$, available from 3M.

525ARI: fused silica with an irregular shape, available from Sibelco.

UHP-2: boron nitride sheets, available from Showa Denko corporation.

Kamin 2000C: kaolin, available from KaMin company.

25B: 2,5-dimethyl-2,5-di(t-butyl peroxy)hexyne-3) peroxide, available from NOF corporation.

Toluene: available from Chambeco Group.

Methyl ethyl ketone: the sources are not limited.

The specimens (samples) are prepared by referring to the methods as follows, and then the characteristics are analyzed according to the specific conditions.

1. Prepregs: the resin compositions of Examples E1-E6 shown as the following Table 1, the resin compositions of Examples E7-E12 shown as the following Table 2, the resin compositions of Comparative Examples C1-C7 shown as the following Table 3 and the resin compositions of Comparative Examples C8-C14 shown as the following Table 4 are selected respectively. Each of the resin compositions is added into a stirring tank and well-mixed to form a varnish, which is loaded to an impregnation tank and then a fiberglass fabric (e.g., style 2116 and 1080 L-glass fiber fabric, available from Asahi company) is impregnated into the impregnation tank to adhere the resin composition onto the fiberglass fabric, followed by heating and baking at 140° C. for 4 minutes to obtain a prepreg.

TABLE 1

|  |  | E1 | E2 | E3 | E4 | E5 | E6 |
|---|---|---|---|---|---|---|---|
| vinyl-containing polyphenylene oxide resin | SA-9000 | 60 | 60 | 60 | 60 | 60 | 60 |
|  | OPE-2st 2200 | 30 | 30 | 30 | 30 | 30 | 30 |
| polyolefin | Ricon 257 | 10 | 10 | 10 | 10 | 10 | 10 |
| flame retardant | PQ-60 | 30 | 30 | 30 | 30 | 30 | 30 |
| chemically synthetic silica | chemically synthetic spherical silica A | 45 | 45 | 45 | 45 | 45 | 30 |
|  | chemically synthetic spherical silica B |  |  |  |  |  | 15 |
| spherical inorganic filler | PTX60 | 15 |  | 10 | 30 | 10 | 15 |
|  | iM16K |  | 15 |  |  | 5 |  |
| fused silica | 525ARI |  |  |  |  |  |  |
| non-spherical inorganic filler | UHP-2 |  |  |  |  |  |  |
|  | Kamin 2000C |  |  |  |  |  |  |

TABLE 1-continued

|  |  | E1 | E2 | E3 | E4 | E5 | E6 |
|---|---|---|---|---|---|---|---|
| curing accelerator | 25B | 0.2 | 0.2 | 0.2 | 0.2 | 0.2 | 0.2 |
| solvent | toluene | 70 | 70 | 70 | 70 | 70 | 70 |
|  | methyl ethyl ketone | 10 | 10 | 10 | 10 | 10 | 10 |

TABLE 2

|  |  | E7 | E8 | E9 | E10 | E11 | E12 |
|---|---|---|---|---|---|---|---|
| vinyl-containing polyphenylene oxide resin | SA-9000 | 60 | 60 | 60 | 60 | 60 | 55 |
|  | OPE-2st 2200 | 30 | 30 | 30 | 30 | 30 | 35 |
| polyolefin | Ricon 257 | 10 | 10 | 8 | 15 | 10 | 10 |
| flame retardant | PQ-60 | 30 | 30 | 30 | 30 | 35 | 25 |
| chemically synthetic silica | chemically synthetic spherical silica A | 35 | 70 | 45 | 45 | 45 | 40 |
|  | chemically synthetic spherical silica B |  |  |  |  |  |  |
| spherical inorganic filler | PTX60 | 15 | 15 | 15 | 15 | 15 | 15 |
|  | iM16K |  |  |  |  |  |  |
| fused silica | 525ARI |  |  |  |  |  |  |
| non-spherical inorganic filler | UHP-2 |  |  |  |  |  |  |
|  | Kamin 2000C |  |  |  |  |  |  |
| curing accelerator | 25B | 0.2 | 0.2 | 0.2 | 0.2 | 0.2 | 0.1 |
| solvent | toluene | 70 | 70 | 70 | 70 | 70 | 55 |
|  | methyl ethyl ketone | 10 | 10 | 10 | 10 | 10 | 25 |

TABLE 3

|  |  | C1 | C2 | C3 | C4 | C5 | C6 | C7 |
|---|---|---|---|---|---|---|---|---|
| vinyl-containing polyphenylene oxide resin | SA-9000 | 60 | 60 | 60 | 60 | 60 | 60 | 60 |
|  | OPE-2st 2200 | 30 | 30 | 30 | 30 | 30 | 30 | 30 |
| polyolefin | Ricon 257 | 10 | 10 | 10 | 10 | 10 | 10 | 10 |
| flame retardant | PQ-60 | 30 | 30 | 30 | 30 | 30 | 30 | 30 |
| chemically synthetic silica | chemically synthetic spherical silica A |  |  | 45 | 45 | 45 | 45 |  |
|  | chemically synthetic spherical silica B |  |  |  |  |  |  |  |
| spherical inorganic filler | PTX60 | 15 | 40 |  |  |  |  |  |
|  | iM16K |  |  |  |  |  |  |  |
| fused silica | 525ARI | 45 |  | 15 |  |  | 45 | 45 |
| non-spherical inorganic filler | UHP-2 |  |  |  | 15 |  | 15 |  |
|  | Kamin 2000C |  |  |  |  | 15 |  | 15 |
| curing accelerator | 25B | 0.2 | 0.2 | 0.2 | 0.2 | 0.2 | 0.2 | 0.2 |
| solvent | toluene | 70 | 70 | 70 | 70 | 70 | 70 | 70 |
|  | methyl ethyl ketone | 10 | 10 | 10 | 10 | 10 | 10 | 10 |

TABLE 4

|  |  | C8 | C9 | C10 | C11 | C12 | C13 | C14 |
|---|---|---|---|---|---|---|---|---|
| vinyl-containing polyphenylene oxide resin | SA-9000 | 60 | 60 | 60 | 60 | 60 | 60 | 60 |
|  | OPE-2st 2200 | 30 | 30 | 30 | 30 | 30 | 30 | 30 |
| polyolefin | Ricon 257 | 10 | 10 | 10 | 10 | 10 | 10 | 10 |
| flame retardant | PQ-60 | 30 | 30 | 30 | 30 | 30 | 30 | 30 |

TABLE 4-continued

| | | C8 | C9 | C10 | C11 | C12 | C13 | C14 |
|---|---|---|---|---|---|---|---|---|
| chemically synthetic silica | chemically synthetic spherical silica A | 60 | 0 | 0 | 0 | 45 | 45 | 45 |
| | chemically synthetic spherical silica B | | | | | | | |
| spherical inorganic filler | PTX60 | 0 | 60 | | | | 5 | |
| | iM16K | | | 60 | | 40 | | 5 |
| fused silica | 525ARI | | | | 60 | | | |
| non-spherical inorganic filler | UHP-2 | | | | | | | |
| | Kamin 2000C | | | | | | | |
| curing accelerator | 25B | 0.2 | 0.2 | 0.2 | 0.2 | 0.2 | 0.2 | 0.2 |
| solvent | toluene | 70 | 70 | 70 | 70 | 70 | 70 | 70 |
| | methyl ethyl ketone | 10 | 10 | 10 | 10 | 10 | 10 | 10 |

All examples E1-E12 of Table 1 and Table 2 comprise polyolefin (Ricon 257) as crosslinking agent, but the invention is not limited thereto. In an embodiment, the resin composition of the invention comprises polyolefin or other crosslinking agent. In an embodiment, the resin composition of the invention fails to comprise polyolefin or other crosslinking agent. In an implementation, polyolefin or other crosslinking agent is added in the step of "each of the resin compositions is added into a stirring tank and well-mixed to form a varnish".

All examples E1-E12 of Table 1 and Table 2 comprise p-xylylene-bis-diphenylphosphine oxide (PQ-60) as flame retardant, but the invention is not limited thereto. In an embodiment, the resin composition of the invention comprises p-xylylene-bis-diphenylphosphine oxide or other flame retardant. In an embodiment, the resin composition of the invention fails to comprise p-xylylene-bis-diphenylphosphine oxide or other flame retardant. In an implementation, p-xylylene-bis-diphenylphosphine oxide or other flame retardant is added in the step of "each of the resin compositions is added into a stirring tank and well-mixed to form a varnish".

All examples E1-E12 of Table 1 and Table 2 comprise initiator (25B) as curing accelerator, but the invention is not limited thereto. In an embodiment, the resin composition of the invention comprises 25B or other curing accelerator. In an embodiment, the resin composition of the invention fails to comprise 25B or other curing accelerator. In an implementation, 25B or other curing accelerator is added in the step of "each of the resin compositions is added into a stirring tank and well-mixed to form a varnish".

All examples E1-E12 of Table 1 and Table 2 comprise toluene and methyl ethyl ketone (MEK) as solvent, but the invention is not limited thereto. In an embodiment, the resin composition of the invention comprises toluene or methyl ethyl ketone. In an embodiment, the resin composition of the invention fails to comprise toluene or methyl ethyl ketone, and is changed to use other solvents. In an implementation, toluene and methyl ethyl ketone or other solvents are simultaneously added in the step of "each of the resin compositions is added into a stirring tank and well-mixed to form a varnish".

2. Copper-containing laminate (it is also called copper clad laminate, 8-ply, formed by lamination of eight prepregs): Two 18 μm HVLP (Hyper Very Low Profile) copper foils and eight prepregs obtained from 2116 L-fiberglass fabrics impregnated with each specimen (each Example or Comparative Example) and having a resin content of about 55% were prepared and stacked in the order of copper foil, eight prepregs and copper foil, followed by lamination under vacuum at 30 kgf/cm² pressure and 200° C. temperature for 120 minutes to form a copper-containing laminate. Insulation layers were formed by laminating eight sheets of prepreg between the two copper foils, and the resin content of the insulation layers is about 55%.

3. Copper-containing laminate (it is also called copper clad laminate, 2-ply, formed by lamination of two prepregs): Two 18 μm HVLP (Hyper Very Low Profile) copper foils and two prepregs obtained from 1080 L-fiberglass fabrics impregnated with each specimen (each Example or Comparative Example) and having a resin content of about 70% were prepared and stacked in the order of copper foil, two prepregs and copper foil, followed by lamination under vacuum at 30 kgf/cm² pressure and 200° C. temperature for 120 minutes to form a copper-containing laminate. Insulation layers were formed by laminating two sheets of prepreg between the two copper foils, and the resin content of the insulation layers is about 70%.

4. Copper-free laminate (8-ply, formed by lamination of eight prepregs): Each aforesaid copper-containing laminate (8-ply) was etched to remove the two copper foils to obtain a copper-free laminate (8-ply) formed by laminating eight sheets of prepreg and having a resin content of about 55%.

5. Copper-free laminate (2-ply, formed by lamination of two prepregs): Each aforesaid copper-containing laminate (2-ply) was etched to remove the two copper foils to obtain a copper-free laminate (2-ply) formed by laminating two sheets of prepreg and having a resin content of about 70%.

Peeling Strength (P/S)

The copper-containing laminate (formed by lamination of eight prepregs) was selected and cut into a rectangle specimen with a width of 24 mm and a length of greater than 60 mm, and the surface copper foil was etched and only a strip of copper foil with a width of 3.18 mm and a length of greater than 60 mm was left, and tested by using a universal tensile strength tester by reference to the method of IPC-TM-650 2.4.8 at room temperature (about 25° C.), the specimen was tested to measure the force, unit being lb/in, required to separate the copper foil from a surface of the insulation layer of the laminate. In the present field, the larger peeling strength, the better a copper-containing laminate is. For a copper clad laminate having a measured value of dissipation factor of less than 0.0040 at a frequency of 10 GHz, a difference in peeling strength of greater than 0.1 lb/in represents a significant difference.

Dissipation Factor (Df)

In dissipation factor measurement, the copper-free laminate (formed by lamination of two prepregs, and having a resin content of about 70%) was selected as a specimen. Each specimen is tested by using a microwave dielectrometer available from AET Corp. by reference to the method of JIS C2565 at a frequency of 10 GHz, at room temperature (about 25° C.). Lower dissipation factor represents better dielectric properties of the specimen. For a copper clad laminate having a measured value of dissipation factor of less than 0.0040 at a frequency of 10 GHz, a difference in Df of less than 0.0001 represents there is no significant difference in dissipation factor of laminates (no significant difference represents that there is no significant technical difficulty), a difference in Df of greater than or equal to 0.0001 represents a significant difference in dissipation factor of different laminates.

Dielectric Constant (Dk)

In dielectric constant measurement, the copper-free laminate (formed by lamination of two prepregs, and having a resin content of about 70%) was selected as a specimen. Each specimen is tested by using a microwave dielectrometer available from AET Corp. by reference to the method of JIS C2565 at a frequency of 10 GHz, at room temperature (about 25° C.). Lower dielectric constant represents better dielectric properties of the specimen. For a copper clad laminate having a measured value of dissipation factor of less than 0.0040 at a frequency of 10 GHz, a difference in Dk of less than 0.01 represents there is no significant difference in dissipation factor of laminates (no significant difference represents that there is no significant technical difficulty), a difference in Dk of greater than or equal to 0.01 represents a significant difference in dissipation factor of different laminates.

Laminate Appearance Inspection

Visually inspect, with naked eyes, the surface of each copper-free laminate (formed by lamination of eight prepregs) to determine whether it is flat and smooth or having weave exposure. The planar size of the copper-free laminate is 9×12 inch. If at least one weave exposure greater than 1×1 cm² on the copper-free laminate is found, it is determined as weave exposure. In other words, a laminate with flat and smooth surface is not designated as weave exposure. Weave exposure is as known by a skilled person in the art, for example FIG. 1. Laminates having weave exposure cannot be subject to subsequent processes for producing multi-layer boards or circuit boards.

Branch-Like Pattern Formation at Laminate Edge After Lamination (Branch-like Pattern)

Figure 2:
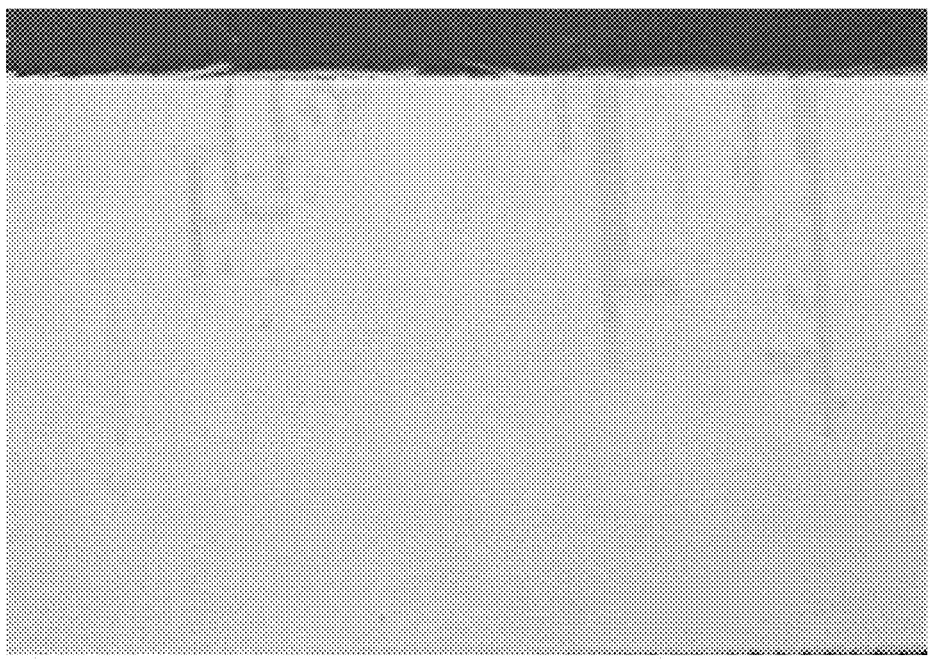
FIG. 2 is a schematic view of a copper-free laminate having a branch-like pattern.
Figure 3:
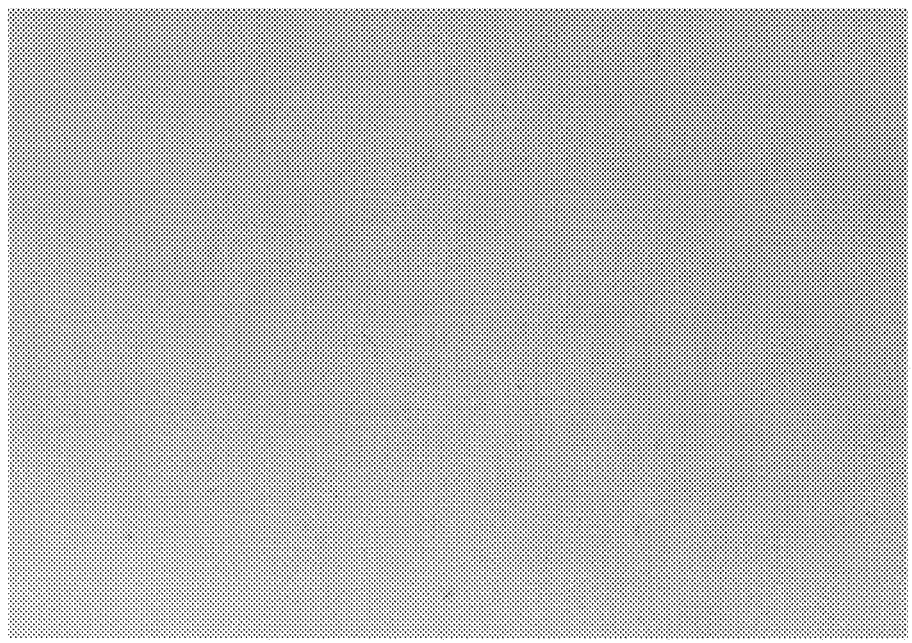
FIG. 3 is a schematic view of a normal copper-free laminate having no branch-like pattern.

The surface of the insulation layer of the copper-free laminate (formed by lamination of eight prepregs) was examined with naked eyes to determine whether branch-like pattern was formed at the laminate edge, which represents poor compatibility of the resin composition or high flowability variation that causes inhomogeneity. A schematic view of a copper-free laminate having branch-like pattern is shown as FIG. 2, calculating the number of stripes in branch-like pattern, the more number of stripes represents the more serious the branch-like pattern, and a schematic view of a normal copper-free laminate having no branch-like pattern is shown as FIG. 3. Presence of branch-like pattern will cause several drawbacks including inconsistent properties (poor reliability) of circuit boards made therefrom and significantly lowered yield, such as poor dielectric properties, low thermal resistance, inconsistent thermal expansion or poor interlayer adhesion. Therefore, laminates having branch-like pattern must be scrapped directly.

The evaluation of the results of Examples E1 to E12 and Comparative Examples C1 to C14 is shown in Table 5 to Table 8 below.

TABLE 5

| properties | unit | E1 | E2 | E3 | E4 | E5 | E6 |
|---|---|---|---|---|---|---|---|
| HVLP P/S (Hoz) | lb/in | 3.15 | 3.25 | 3.26 | 3.04 | 3.21 | 3.10 |
| Df@10 GHz, L-glass RC = 70% | none | 0.0027 | 0.0029 | 0.0028 | 0.0026 | 0.0028 | 0.0027 |
| Dk@10 GHz, L-glass RC = 70% | none | 3.15 | 3.05 | 3.13 | 3.26 | 3.11 | 3.05 |
| laminate appearance (weave exposure) | none | none | none | none | none | none | none |
| branch-like patterns formed at the laminate edge (branch-like pattern) | stripes | 0 | 0 | 0 | 0 | 0 | 0 |

TABLE 6

| properties | unit | E7 | E8 | E9 | E10 | E11 | E12 |
|---|---|---|---|---|---|---|---|
| HVLP P/S (Hoz) | lb/in | 3.22 | 3.02 | 3.16 | 3.09 | 3.08 | 3.25 |
| Df@10 GHz, L-glass RC = 70% | none | 0.0027 | 0.0027 | 0.0029 | 0.0026 | 0.0027 | 0.0028 |
| Dk@10 GHz, L-glass RC = 70% | none | 3.09 | 3.35 | 3.17 | 3.10 | 3.18 | 3.16 |

TABLE 6-continued

| properties | unit | E7 | E8 | E9 | E10 | E11 | E12 |
|---|---|---|---|---|---|---|---|
| laminate appearance (weave exposure) | none | none | none | none | none | none | none |
| branch-like patterns formed at the laminate edge (branch-like pattern) | stripes | 0 | 0 | 0 | 0 | 0 | 0 |

TABLE 7

| properties | unit | C1 | C2 | C3 | C4 | C5 | C6 | C7 |
|---|---|---|---|---|---|---|---|---|
| HVLP P/S (Hoz) | lb/in | 3.11 | 2.81 | 3.29 | 2.96 | 3.25 | 3.15 | 3.27 |
| Df@10 GHz, L-glass RC = 70% | none | 0.0048 | 0.0026 | 0.0049 | 0.0027 | 0.0046 | 0.0049 | 0.0058 |
| Dk@10 GHz, L-glass RC = 70% | none | 3.21 | 3.41 | 3.35 | 3.16 | 3.45 | 3.28 | 3.52 |
| laminate appearance (weave exposure) | none | none | none | weave exposure | none | none | none | none |
| branch-like patterns formed at the laminate edge (branch-like pattern) | stripes | 5 | 0 | 0 | 12 | 6 | 12 | 27 |

TABLE 8

| properties | unit | C8 | C9 | C10 | C11 | C12 | C13 | C14 |
|---|---|---|---|---|---|---|---|---|
| HVLP P/S (Hoz) | lb/in | 2.89 | 2.70 | 3.22 | 3.21 | 2.95 | 3.36 | 3.37 |
| Df@10 GHz, L-glass RC = 70% | none | 0.0028 | 0.0026 | 0.0034 | 0.0056 | 0.0031 | 0.0026 | 0.0026 |
| Dk@10 GHz, L-glass RC = 70% | none | 3.28 | 3.37 | 3.02 | 3.17 | 3.12 | 3.39 | 3.41 |
| laminate appearance (weave exposure) | none | none | none | weave exposure | weave exposure | none | weave exposure | none | none |
| branch-like patterns formed at the laminate edge (branch-like pattern) | stripes | 0 | 0 | 0 | 6 | 0 | 0 | 0 |

The Evaluation of the Results of Examples and Comparative Examples

It can be known from the comparison of Examples E1 to E12 and Comparative Examples C1 to C14 that Comparative Example C1 uses fused silica with an irregular shape instead of spherical chemically synthetic silica so as to demonstrate poor dissipation factor (Df@10 GHz=0.0048), and produce 5 stripes of branch-like patterns at the laminate edge;

Comparative Example C2 uses excessive spherical boron nitride (the amount of spherical boron nitride being 40 parts by weight) so as to demonstrate poor peeling strength (P/S=2.81 lb/in), poor dielectric constant (Dk@10 GHz=3.41) and produce weave exposure; Comparative Example C12 uses excessive spherical hollow boron silicate (the amount of spherical hollow boron silicate being 40 parts by weight) so as to produce weave exposure; Comparative Example C13 uses less spherical boron nitride (the amount of spherical boron nitride being 5 parts by weight) so as to demonstrate poor dielectric constant (Dk@10 GHz=3.39); C14 uses less spherical hollow boron silicate (the amount of spherical hollow boron silicate being 5 parts by weight) so as to demonstrate poor dielectric constant (Dk@10 GHz=3.41);

Comparative Example C3 uses fused silica with an irregular shape instead of spherical boron nitride, Comparative Example C4 uses boron nitride sheets instead of spherical boron nitride, and Comparative Example C5 uses kaolin instead of spherical boron nitride, so that C3 demonstrates poor dissipation factor (Df@10 GHz=0.0049) and dielectric constant (Dk@10 GHz=3.35); C4 produces 12 stripes of branch-like patterns at the laminate edge; C5 demonstrates poor dissipation factor (Df@10 GHz=0.0046), dielectric constant (Dk@10 GHz=3.45) and produces 6 stripes of branch-like patterns at the laminate edge;

Comparative Example C8 only uses chemically synthetic silica and fails to use spherical boron nitride so that C8 demonstrates poor peeling strength (P/S=2.89 lb/in); Comparative Example C9 only uses spherical boron nitride and fails to use chemically synthetic silica so that C9 demonstrates poor peeling strength (P/S=2.70 lb/in), dielectric constant (Dk@10 GHz=3.37) and produces weave exposure;

Comparative Example C10 only uses spherical hollow boron silicate and fails to use chemically synthetic silica so that C10 produces weave exposure.

It can be known from Table 5 to Table 8 and the above description that Examples E1 to E12 can simultaneously achieve better peeling strength (P/S>3.00 lb/in), for example between 3.02 lb/in and 3.26 lb/in (including two ends of 3.02 lb/in and 3.26 lb/in), dissipation factor (Df@10 GHz<0.0030), for example between 0.0026 and 0.0029 (including two ends of 0.0026 and 0.0029), dielectric constant (Dk@10 GHz<3.40), for example between 3.05 and 3.35 (including two ends of 3.05 and 3.35), no weave exposure produced, and no stripes of branch-like patterns produced at the laminate edge (branch-like patterns formed at the laminate edge=0). Conversely, one or more of the above properties of Comparative Examples C1 to C14 cannot achieve the above effect.

While the present disclosure has been described by means of specific embodiments, numerous modifications and variations could be made thereto by those skilled in the art without departing from the scope and spirit of the present disclosure set forth in the claims. Therefore, the scope of the invention is indicated by the appended claims.

What is claimed is:

1. A resin composition, comprising:
   90 parts by weight of vinyl-containing polyphenylene oxide resin;
   35 to 70 parts by weight of chemically synthetic silica; and
   10 to 30 parts by weight of spherical inorganic fillers, wherein the spherical inorganic fillers comprise spherical boron nitride, spherical hollow boron silicate or a combination thereof.

2. The resin composition according to claim 1, wherein the vinyl-containing polyphenylene oxide resin comprises vinylbenzyl polyphenylene oxide resin, methacrylate polyphenylene oxide resin, allyl polyphenylene oxide resin, vinylbenzyl-modified bisphenol A polyphenylene oxide, vinyl chain-extended polyphenylene oxide or a combination thereof.

3. The resin composition according to claim 1, wherein the chemically synthetic silica comprises silica synthesized by chemical method, having a median particle diameter (D50) of 0.01 to 9 micrometer.

4. The resin composition according to claim 1, wherein the chemically synthetic silica is selected from silica synthesized by chemical method, made by microemulsion.

5. The resin composition according to claim 1, wherein the spherical boron nitride comprises spherical boron nitride with an aspect ratio of 1 to 2.

6. The resin composition according to claim 1, wherein the spherical boron nitride comprises spherical boron nitride agglomerates by agglomerating hexagonal boron nitride sheets.

7. The resin composition according to claim 1, wherein the spherical hollow boron silicate comprises spherical hollow boron silicate with a density of 0.12 to 0.6 g/cm$^3$.

8. The resin composition according to claim 1, further comprising maleimide resin, small molecular vinyl compound, acrylate, polyolefin, epoxy resin, cyanate ester resin, phenolic resin, benzoxazine resin, styrene maleic anhydride, polyester resin, amine curing agent, polyamide resin, polyimide resin or a combination thereof.

9. The resin composition according to claim 1, further comprising flame retardant, inorganic fillers other than the spherical boron nitride and the spherical hollow boron silicate, curing accelerator, solvent, silane coupling agent, coloring agent, toughening agent or a combination thereof.

10. An article, which is made from the resin composition according to claim 1, wherein the article comprises a prepreg, a resin film, a laminate or a printed circuit board.

11. The article according to claim 10, which has one, more or all of the following properties:
   a peel strength as measured by reference to the method of IPC-TM-650 2.4.8 is greater than or equal to 3.00 lb/in;
   a dissipation factor at a frequency of 10 GHz as measured by reference to the method of JIS C2565 is less than or equal to 0.0030;
   a dielectric constant at a frequency of 10 GHz as measured by reference to the method of JIS C2565 is less than or equal to 3.40;
   a surface of laminate appearance is flat and smooth without producing a weave exposure;
   no branch-like pattern is produced at a laminate edge after lamination.

* * * * *